United States Patent
Yoshinaga et al.

(10) Patent No.: US 11,183,961 B2
(45) Date of Patent: Nov. 23, 2021

(54) ARITHMETIC CIRCUIT, CONTROL CIRCUIT, AND DISPLAY ORIENTATION DETECTING SYSTEM

(71) Applicant: Nidec Corporation, Kyoto (JP)

(72) Inventors: Masaki Yoshinaga, Kyoto (JP); Taro Amagai, Kyoto (JP); Akiko Ikeda, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 602 days.

(21) Appl. No.: 16/125,805

(22) Filed: Sep. 10, 2018

(65) Prior Publication Data

US 2019/0097564 A1    Mar. 28, 2019

(30) Foreign Application Priority Data

Sep. 27, 2017  (JP) .............................. JP2017-186710

(51) Int. Cl.
| | |
|---|---|
| *H03M 1/48* | (2006.01) |
| *H02P 27/08* | (2006.01) |
| *G02B 26/08* | (2006.01) |
| *G02B 26/10* | (2006.01) |
| *H03F 3/45* | (2006.01) |
| *H03K 5/00* | (2006.01) |
| *H04N 3/14* | (2006.01) |
| *H03M 1/20* | (2006.01) |
| *H04N 5/30* | (2006.01) |
| *H03M 1/56* | (2006.01) |
| *H03K 5/24* | (2006.01) |

(52) U.S. Cl.
CPC .......... *H02P 27/08* (2013.01); *G02B 26/0816* (2013.01); *G02B 26/10* (2013.01); *H03F 3/45* (2013.01); *H03F 3/45475* (2013.01); *H03F 3/45596* (2013.01); *H03K 5/00* (2013.01); *H03M 1/203* (2013.01); *H03M 1/56* (2013.01); *H04N 3/14* (2013.01); *H04N 5/30* (2013.01); *H03K 5/24* (2013.01)

(58) Field of Classification Search
CPC ...... H03M 1/56; H03M 1/123; H03M 1/1023; H03M 1/365; H03M 1/204; H03M 1/1245; H03M 1/0607; H03M 1/36; H03M 1/167; H03M 1/08; H03M 1/0863; H03M 1/12; H03M 1/146
USPC ................................ 341/118–121, 143, 155
See application file for complete search history.

(56) References Cited

U.S. PATENT DOCUMENTS

| | | | |
|---|---|---|---|
| 6,509,746 B1 * | 1/2003 | Wang ....................... | G01D 5/24 324/678 |
| 10,523,157 B1 * | 12/2019 | Rotzoll ..................... | H03F 3/19 |

(Continued)

FOREIGN PATENT DOCUMENTS

| | | |
|---|---|---|
| CN | 100581050 C | 1/2010 |
| JP | 2017-158230 A | 9/2017 |

OTHER PUBLICATIONS

Official Communication issued in corresponding Chinese Patent Application No. 201811122922.4, dated Feb. 26, 2021.

*Primary Examiner* — Linh V Nguyen

(74) *Attorney, Agent, or Firm* — Keating & Bennett

(57) ABSTRACT

An arithmetic circuit includes an auto-zero amplification circuit that compensates an offset of an entered differential signal, and a comparator circuit that converts an output signal from the auto-zero amplification circuit to a digital signal. The auto-zero amplification circuit and comparator circuit are provided in the same package.

7 Claims, 6 Drawing Sheets

(56) References Cited

U.S. PATENT DOCUMENTS

| | | | |
|---|---|---|---|
| 10,790,791 B2* | 9/2020 | Hegde | H03F 3/45188 |
| 2003/0142086 A1* | 7/2003 | Watanabe | G02B 27/017 |
| | | | 345/204 |
| 2006/0244520 A1* | 11/2006 | Wang | H03F 3/45753 |
| | | | 330/9 |
| 2009/0129438 A1* | 5/2009 | Pan | G01K 7/01 |
| | | | 374/170 |
| 2009/0224712 A1* | 9/2009 | Izaki | F24F 12/006 |
| | | | 318/400.32 |
| 2014/0163911 A1* | 6/2014 | Rohrer | G01R 33/0029 |
| | | | 702/64 |
| 2014/0176238 A1* | 6/2014 | Guo | H03F 3/45475 |
| | | | 330/254 |
| 2015/0249464 A1* | 9/2015 | Cohen | H03M 1/18 |
| | | | 341/155 |
| 2017/0077876 A1* | 3/2017 | Quilligan | H03F 1/26 |
| 2018/0288346 A1* | 10/2018 | Yoshida | H04N 5/363 |
| 2019/0116331 A1* | 4/2019 | Jung | H03M 1/0607 |
| 2020/0366162 A1* | 11/2020 | Yoshinaga | G01R 33/0017 |

\* cited by examiner

ARITHMETIC CIRCUIT, CONTROL CIRCUIT, AND DISPLAY ORIENTATION DETECTING SYSTEM

CROSS REFERENCE TO RELATED APPLICATIONS

This application claims the benefit of priority to Japanese Patent Application No. 2017-186710 filed on Sep. 27, 2017. The entire contents of this application are hereby incorporated herein by reference.

BACKGROUND OF THE INVENTION

1. Field of the Invention

The present disclosure relates to an arithmetic circuit, a control circuit, and a display orientation detecting system.

2. Description of the Related Art

In a conventional practice, a digital circuit, which handles digital signals, and an analog circuit, which handles analog signals, may be used to control the operation of a motor.

From the viewpoint of more reducing a mounting area on a circuit board, it is preferable for both the digital circuit and analog circuit to be formed in the same package. When a digital circuit and an analog circuit are formed in the same package, however, noise is superimposed on an entered signal. This noise causes variations in values detected by various sensors. Therefore, in a circuit that controls a motor, for example, fluctuations are caused in control of rotation to achieve a target rotational speed. These fluctuations in control of rotation may become a jitter in a high-order system and may adversely affect the performance of the system.

SUMMARY OF THE INVENTION

An arithmetic circuit in an exemplary embodiment in the present disclosure includes an auto-zero amplification circuit that compensates an offset of an entered differential signal and also includes a comparator circuit that converts an output signal produced from the auto-zero amplification circuit to a digital signal. The auto-zero amplification circuit and comparator circuit are provided in the same package.

The above and other elements, features, steps, characteristics, and advantages of the present disclosure will become more apparent from the following detailed description of the preferred embodiments with reference to the attached drawings.

DETAILED DESCRIPTION OF THE PREFERRED EMBODIMENTS

A first embodiment in the present disclosure will be described with reference to the drawings. First, an arithmetic circuit 10 will be outlined with reference to FIG. 1.

Figure 1:
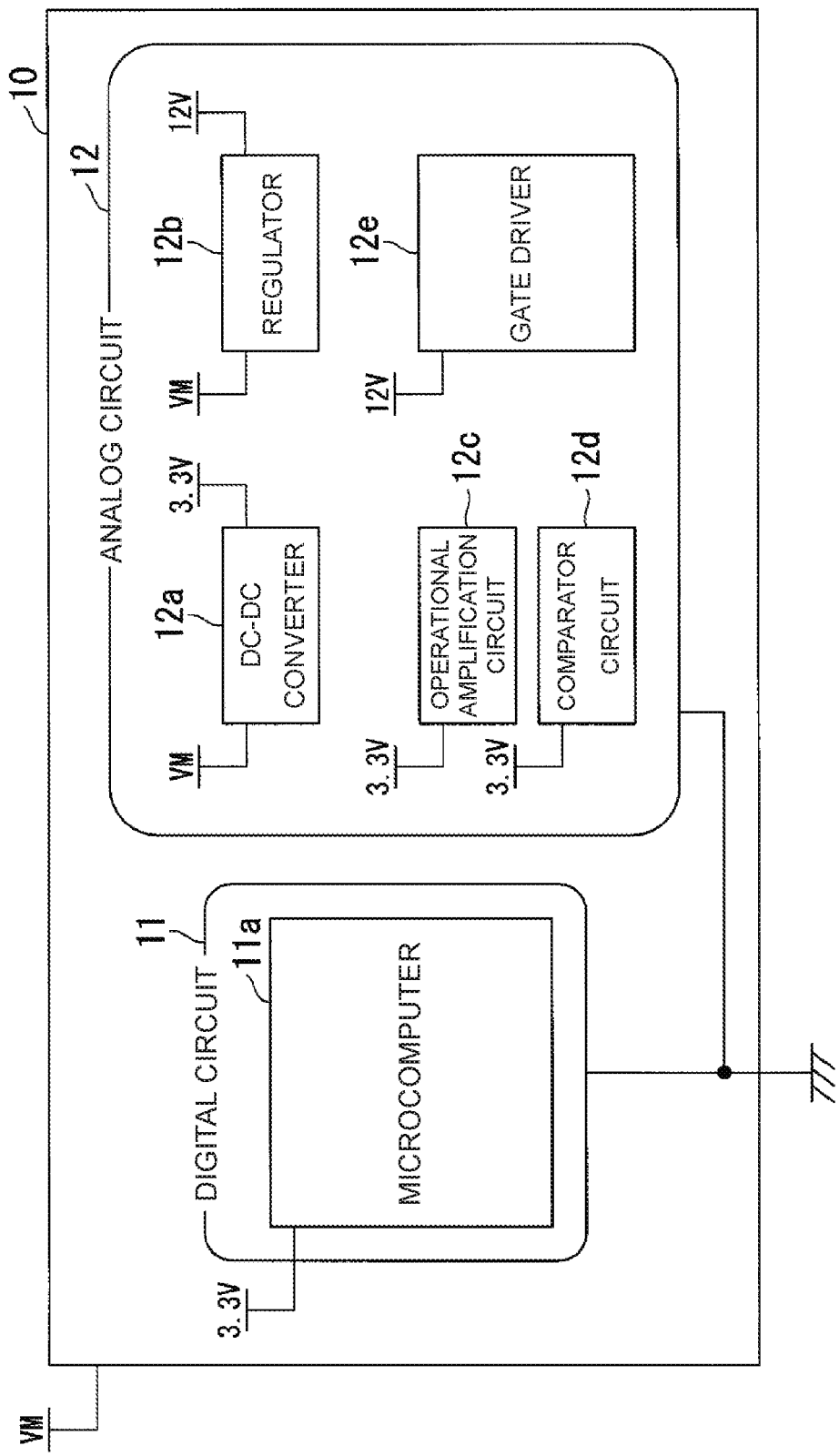
FIG. 1 illustrates an arithmetic circuit according to a first exemplary embodiment of the present invention.

FIG. 1 outlines the arithmetic circuit 10 according to the first embodiment.

In the example in FIG. 1, the arithmetic circuit 10 has a digital circuit 11 and an analog circuit 12 in the same package. The arithmetic circuit 10 is, for example, a general-purpose integrated circuit (IC) that has various functions. The digital circuit 11 in the arithmetic circuit 10 is, for example, a microcomputer 11a. The microcomputer 11a has, for example, a central processing unit (CPU), memories such as a random-access memory (RAM) and a read-only memory (ROM), and various interfaces. The digital circuit 11 may have a large-scale integration (LSI) circuit, an application-specific integrated circuit (ASIC), and a field-programmable gate array (FPGA). The digital circuit 11 operates according to periodic pulse signals (referred to below as operation clocks). Operation clocks are supplied from a clock supply unit (not illustrated). The general-purpose IC is an example of a logical operation circuit.

The analog circuit 12 has, for example, a digital-to-digital (DC-DC) converter 12a, a regulator 12b, an operational amplification circuit 12c, a comparator circuit 12d, and a gate driver 12e. The DC-DC converter 12a and regulator 12b covert a power supply voltage VM applied to the arithmetic circuit 10 to a voltage used in a portion in the arithmetic circuit 10. Specifically, the DC-DC converter 12a converts the power supply voltage VM to, for example, a voltage (3.3 V in the drawing) used in the digital circuit 11, operational amplification circuit 12c, and comparator circuit 12d, and the regulator 12b converts the power supply voltage VM to, for example, a voltage (12 V in the drawing) used in the gate driver 12e included in the arithmetic circuit 10.

The operational amplification circuit 12c amplifies a signal that indicates a detection result produced by a sensor that detects a target eligible for detection (the signal will be referred to below as the detection result signal). The comparator circuit 12d compares the signal amplified by the operational amplification circuit 12c (the signal will be referred to below as the amplified signal) with a reference signal, after which the comparator circuit 12d outputs a digital signal according to the comparison. If, for example, the amplified signal is higher than the reference signal, the digital signal indicates a high level. If the amplified signal is lower than the reference signal, the digital signal indicates a low level. The gate driver 12e is an element that converts a control signal output from the microcomputer 11a to a voltage at a level at which a switching element operates. The microcomputer 11a performs various types of processing according to the digital signal supplied from the comparator circuit 12d. The various types of processing include, for example, processing to supply a control signal to the gate driver 12e.

Figure 2:
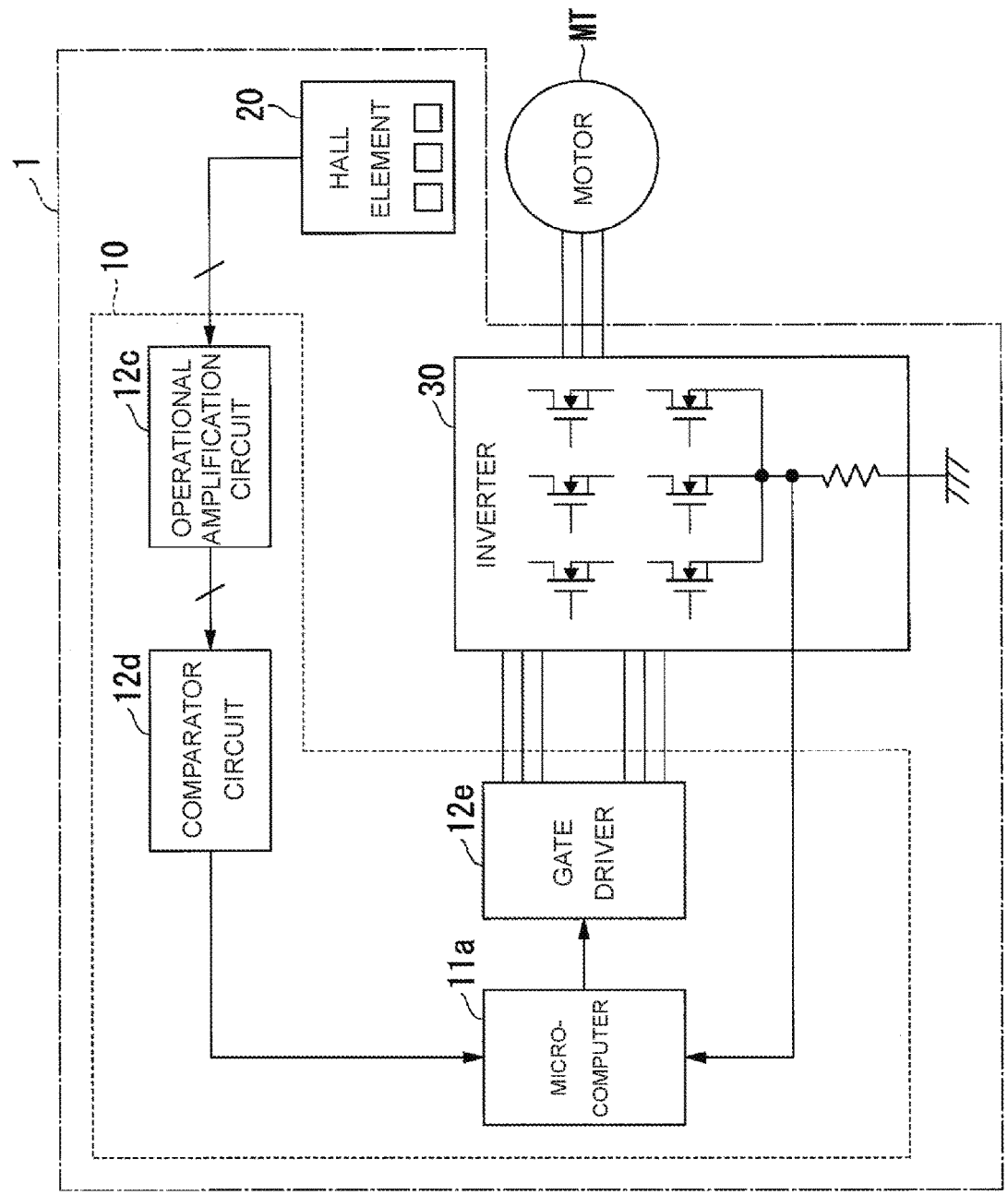
FIG. 2 illustrates an example of a structure of a control circuit in the first exemplary embodiment of the present invention.

FIG. 2 illustrates an example of the structure of a control circuit 1 in the first embodiment.

The control circuit 1 controls the driving of a motor (denoted below by MT). The control circuit 1 has the arithmetic circuit 10, a magnetic sensor (referred to below as the hall element 20), and an inverter 30. The hall element 20 detects the magnetism of the motor MT to be been driven, and supplies a detection result signal representing a detected result to the operational amplification circuit 12c. The detection result signal is, for example, a differential signal. The inverter 30 operates the motor MT according to a control signal output from the gate driver 12e. The control signal is, for example, a pulse width modulation (PWM) signal. The gate driver 12e converts the control signal output from the microcomputer 11a to a level at which a switching element in the inverter 30 operates. The inverter 30 drives the motor MT according to the control signal supplied from the gate driver 12e. The motor MT is a three-phase motor. The gate driver 12e drives the three-phase motor. Furthermore, the microcomputer 11a may supply a control signal to the gate driver 12e according to an overcurrent signal output from the inverter 30. The overcurrent signal indicates that an overcurrent is flowing in the motor MT.

In general, the operational amplification circuit 12c in the arithmetic circuit 10, which is a general-purpose IC, may not be an operational amplification circuit for which countermeasures against noise has been taken. Therefore, noise may be superimposed on the amplified signal amplified by the operational amplification circuit 12c. In this case, a digital signal output from the comparator circuit 12d is based on a reference signal and the amplified signal on which noise has been superimposed. Therefore, the digital signal may not appropriately indicate a timing at which the polarity of the magnetism detected during the rotation of the motor MT changes. If the microcomputer 11a controls the gate driver 12e according to this type of digital signal to drive the motor MT, the rotation of the motor MT may not be appropriately controlled. The operational amplification circuit 12c in the arithmetic circuit 10 in this embodiment has a structure that reduces the effect of noise. The operational amplification circuit 12c will be described below in detail.

Figure 3:
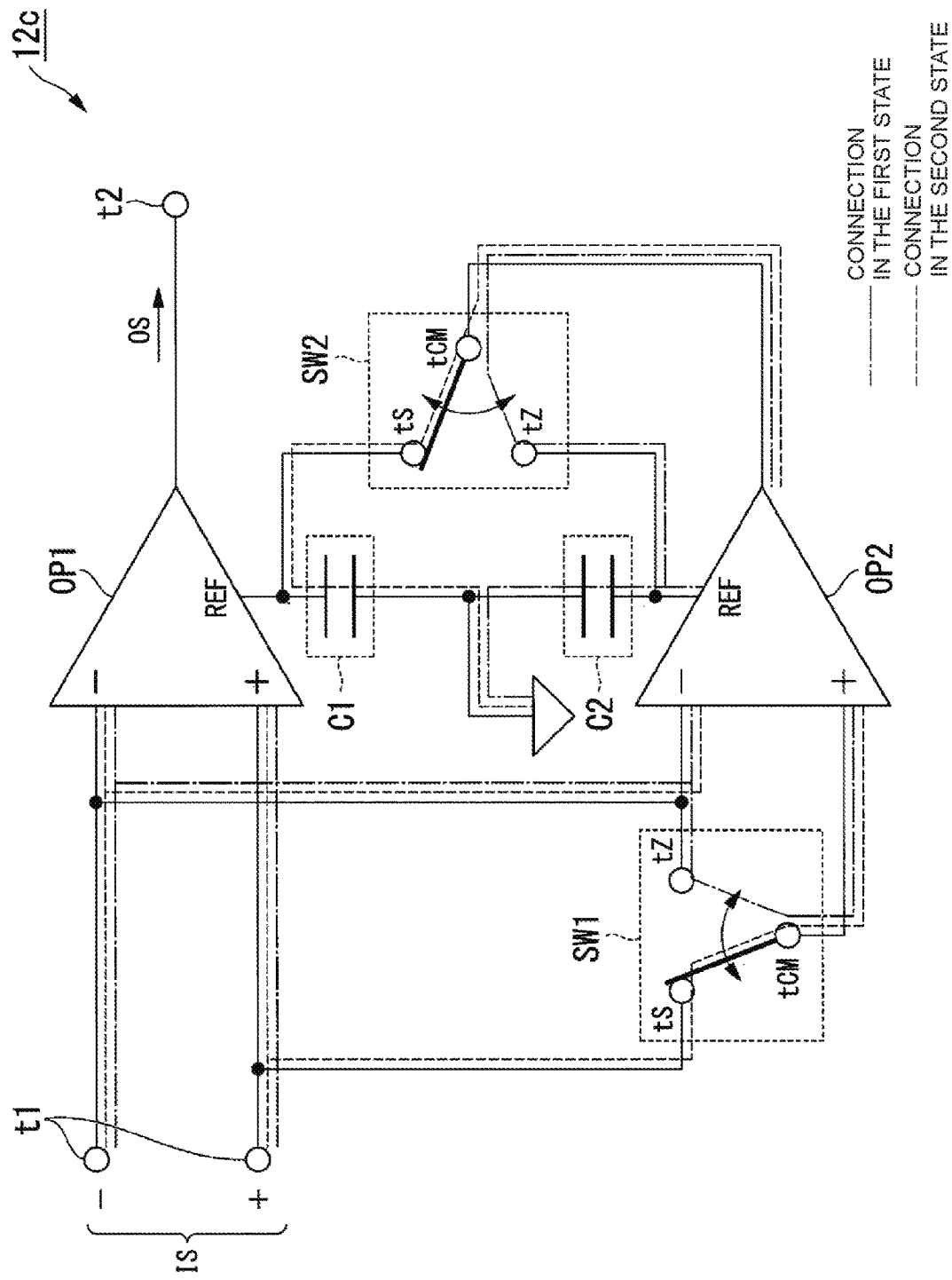
FIG. 3 illustrates an example of a structure of an operational amplification circuit according to the first exemplary embodiment of the present invention.

FIG. 3 illustrates an example of the structure of the operational amplification circuit 12c according to the first embodiment.

The operational amplification circuit 12c is an example of an auto-zero amplification circuit. In the example in FIG. 3, the operational amplification circuit 12c has input terminals t1, an output terminal t2, a first operational amplifier OP1, a second operational amplifier OP2, a three-pole switch SW1, a three-pole switch SW2, a capacitor C1, and a capacitor C2. The three-pole switch SW1 and three-pole switch SW2 each have a first terminal tZ, a second terminal tS, and a common terminal tCM. The input terminals t1 include a positive terminal (indicated by + in the drawing) and a negative terminal (indicated by − in the drawing). The first operational amplifier OP1 and second operational amplifier OP2 each have a NULL terminal (indicated by REF in the drawing). The offset of each of the first operational amplifier OP1 and second operational amplifier OP2 is adjusted with reference to a voltage supplied to the NULL terminal. The first operational amplifier OP1 and second operational amplifier OP2 are elements the characteristics of which are similar. The first operational amplifier OP1 and second operational amplifier OP2 are formed in, for example, the same material in the arithmetic circuit 10 in the same package.

The positive terminal of the input terminals t1, the non-inverting terminal of the first operational amplifier OP1, and the second terminal tS of the three-pole switch SW1 are mutually connected. The negative terminal of the input terminals t1, the inverting terminal of the first operational amplifier OP1, the inverting terminal of the second operational amplifier OP2, and the first terminal tZ of the three-pole switch SW1 are mutually connected. The non-inverting terminal of the second operational amplifier OP2 and the common terminal tCM of the three-pole switch SW1 are mutually connected. The output terminal of the first operational amplifier OP1 and the output terminal t2 are mutually connected. The output terminal of the second operational amplifier OP2 and the common terminal tCM of the three-pole switch SW2 are mutually connected. The NULL terminal of the first operational amplifier OP1, the second terminal tS of the three-pole switch SW2, and one end of the capacitor C1 are mutually connected. The other end of the capacitor C1 is grounded. The NULL terminal of the second operational amplifier OP2, the first terminal tZ of the three-pole switch SW2, and one end of the capacitor C2 are mutually connected. The other end of the capacitor C2 is grounded.

The operational amplification circuit 12c has two states that depend on the connection states of the three-pole switch SW1 and three-pole switch SW2. The three-pole switch SW1 and three-pole switch SW2 are each a device the state of which is switched according to either of the two states of the operational amplification circuit 12c. In the description below, the two states of the operational amplification circuit 12c will be referred to as the first state and second state. In the first state, the offset voltage of the second operational amplifier OP2 is adjusted. In the second state, the offset voltage of the first operational amplifier OP1 is adjusted. The three-pole switch SW1 and three-pole switch SW2 make a switchover according to an operation clock supplied from the clock supply unit. The operational amplification circuit 12c is alternately placed in the first state and second state. Therefore, a switchover is made between the first state and the second state according to the operation clock. A detection result signal, which is a differential signal, is entered from the hall element 20 into the input terminal t1. The first operational amplifier OP1 amplifies the entered detection result signal regardless whether the operational amplification circuit 12c is in the first state or second state, after which the first operational amplifier OP1 outputs an amplified output (denoted by OS in the drawing). The first state and second state will be described below in detail.

In the first state, in the three-pole switch SW1 and three-pole switch SW2, the first terminal tZ and common terminal tCM are mutually connected. Thus, the non-inverting terminal and inverting terminal of the second operational amplifier OP2 are mutually connected. The offset voltage of the second operational amplifier OP2 is output from the output terminal of the second operational amplifier OP2 and is then entered into the NULL terminal of the second operational amplifier OP2. The offset voltage of the second operational amplifier OP2 is charged in the capacitor C2.

In the second state, in the three-pole switch SW1 and three-pole switch SW2, the second terminal tS and common terminal tCM are mutually connected. In the first state, a voltage indicating the offset voltage of the second operational amplifier OP2, the offset voltage having been charged in the capacitor C2, is entered into the NULL terminal of the second operational amplifier OP2. In the second state, therefore, the second operational amplifier OP2 operates with the offset voltage compensated. In the second state, a detection result signal is entered into the second operational amplifier OP2 as with the first operational amplifier OP1. The first operational amplifier OP1 and second operational amplifier OP2 have similar characteristics as described above. In the second state, therefore, the second operational amplifier OP2 outputs a voltage similar to the offset voltage of the first operational amplifier OP1, with the offset voltage compensated. The voltage, output from the second operational amplifier OP2, that is similar to the offset voltage of the first operational amplifier OP1 is entered into the NULL terminal of the first operational amplifier OP1. In the second state, therefore, the first operational amplifier OP1 operates with the offset voltage compensated. The voltage, output from the second operational amplifier OP2, that is similar to the offset voltage of the first operational amplifier OP1 is charged in the capacitor C1.

Since, in the second state, the offset voltage of the first operational amplifier OP1 is charged in the capacitor C1, the first operational amplifier OP1 compensates the offset voltage by using the capacitor C1 connected to the NULL terminal in a next first state. In the first state, therefore, the first operational amplifier OP1 operates with the offset voltage compensated. As a result, 1/f noise can be reduced.

The two states of the operational amplification circuit 12c are repeated in a cycle that is adequately shorter than the cycle of the detection result signal. Specifically, the two states of the operational amplification circuit 12c are repeated in a cycle equal to or shorter than half the cycle of the detection result signal.

Figure 4:
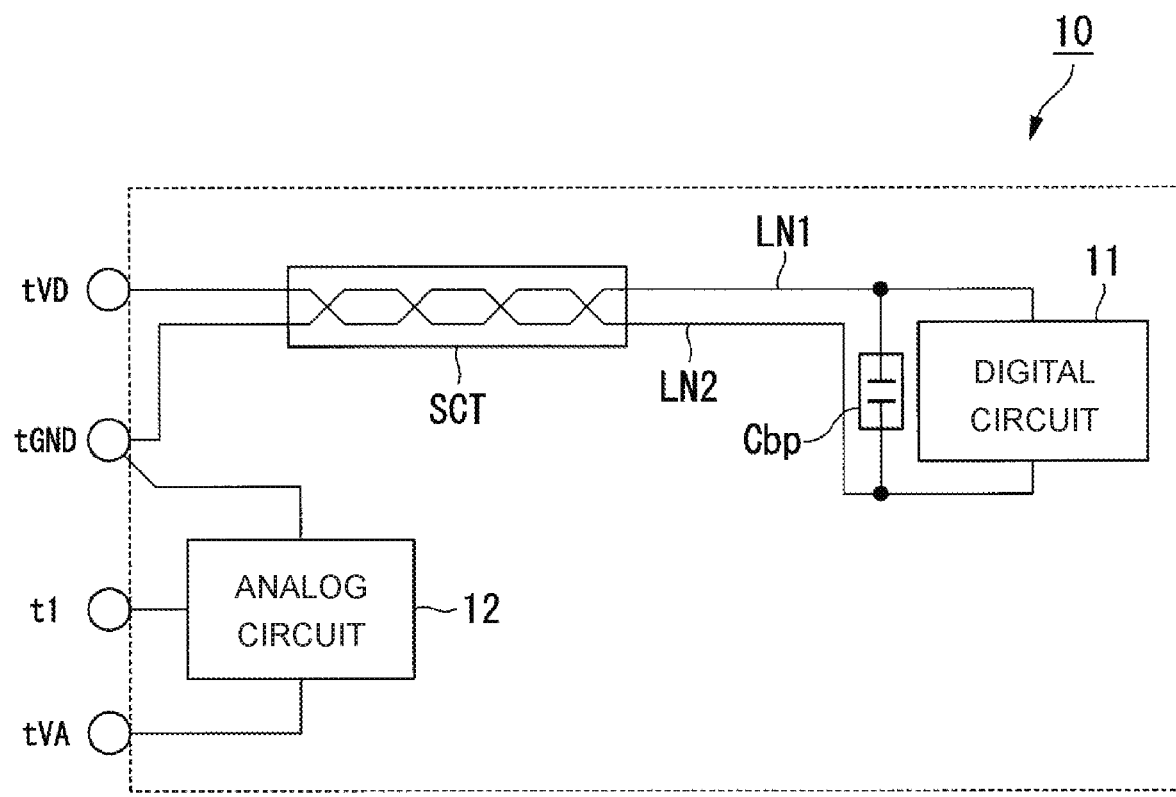
FIG. 4 illustrates an example of the wiring of power supply lines of the arithmetic circuit according to the first exemplary embodiment of the present invention.

FIG. 4 illustrates an example of the wiring of power supply lines of the arithmetic circuit 10 according to the first embodiment.

The arithmetic circuit 10 has a plurality of external terminals. In FIG. 4, four terminals are indicated, which are a digital voltage terminal tVD, an input terminal t1, an analog voltage terminal tVA, and a common ground terminal tGND; these terminals are part of the external terminals of the arithmetic circuit 10. The digital voltage terminal tVD outputs a voltage (in this example, 3.3 V) used in the digital circuit 11. The input terminal t1 accepts a detection result signal to be entered into the analog circuit 12. The input terminal t1 is connected to the hall element 20. The analog voltage terminal tVA outputs a voltage (in this example, 12 V) used in the analog circuit 12.

Although a case has been described above in which the external terminals are the digital voltage terminal tVD, common ground terminal tGND, input terminal t1, and analog voltage terminal tVA, this is not a limitation. The digital voltage terminal tVD, common ground terminal tGND, input terminal t1, and analog voltage terminal tVA may be, for example, internal terminals placed in the arithmetic circuit 10. Alternatively, the digital voltage terminal tVD, common ground terminal tGND, input terminal t1, and analog voltage terminal tVA may not be included as terminals. In this case, these terminals are the generic names of wires at the same potentials as the voltages described above. For convenience of explanation, a case will be described below in which the external terminals are the digital voltage terminal tVD, common ground terminal tGND, input terminal t1, and analog voltage terminal tVA.

In the example in FIG. 4, the voltage used in the digital circuit 11 and the voltage used in the analog circuit 12 are grounded through a common terminal (specifically, the common ground terminal tGND). A line that mutually connects the digital circuit 11 and digital voltage terminal tVD (the line will be referred to below as the line LN1) and a line that mutually connects the digital circuit 11 and common ground terminal tGND (the line will be referred to below as the line LN2) are provided as twisted pair lines (indicated by a twisted portion SCT in the drawing). Specifically, the line LN1 and line LN2 are formed from a material used to form the arithmetic circuit 10 so as to become twisted pair lines. The twisted pair lines may be twisted on a plane parallel to a plane on which the package is mounted or may be twisted in a direction orthogonal to the plane on which the package is mounted. The material from which the arithmetic circuit 10 is formed is, for example, a semiconductor material. The line LN1 is an example of a positive-pole pattern of the power supply lines. The line LN2 is an example of a negative-pole pattern of the power supply lines.

In the example in FIG. 4, a bypass capacitor Cbp is placed in the vicinity of the digital circuit 11 and between the line LN1 and the line LN2. The bypass capacitor Cbp has a capacitance that is enough to prevent the potentials of the line LN1 and line LN2 from being affected by the operation of the digital circuit 11. The capacitance of the bypass capacitor Cbp is, for example, such that the degree to which the potentials of the line LN1 and line LN2 vary according to the output of the control signal (PWM signal) is lessened.

As described above, the arithmetic circuit 10 in this embodiment has an auto-zero amplification circuit (in this example, the operational amplification circuit 12c) that compensates the offset of an entered differential signal and also has the comparator circuit 12d that converts an output signal (in this example, an amplified signal) produced from the operational amplification circuit 12c to a digital signal. The operational amplification circuit 12c and comparator circuit 12d are formed in the same package. With the arithmetic circuit 10 in this embodiment, a digital circuit and an analog circuit can be formed in the same package.

The arithmetic circuit 10 in this embodiment has a clock supply unit that supplies an operation clock, which is a periodic pulse signal, and a logical operation circuit (in this example, the microcomputer 11a) that operates according to the clock supply unit. The operational amplification circuit 12c has the first operational amplifier OP1 that amplifies a differential signal and produces an output signal and also has the second operational amplifier OP2 that adjusts the offset voltage of the first operational amplifier OP1. The operational amplification circuit 12c has two states, which are a first state in which the offset voltage of the second operational amplifier OP2 is adjusted and a second state in which the offset voltage of the first operational amplifier OP1 is adjusted by using an output from the second operational amplifier OP2 having the offset voltage that has been adjusted in the first state. The operation clock supplied by the clock supply unit is used to select a switching timing signal for use in switching between the first state and the second state.

Figure 5:
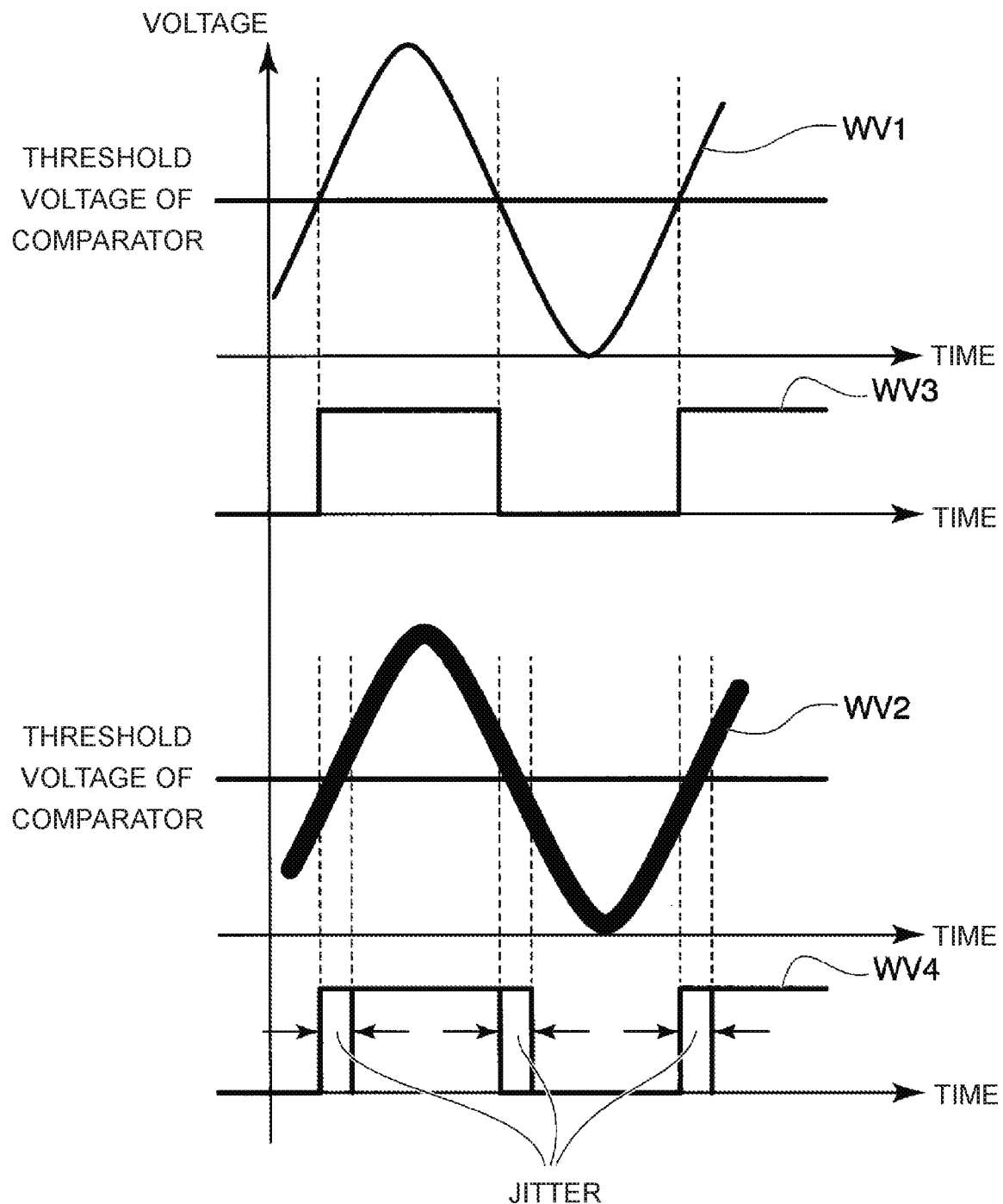
FIG. 5 illustrates an example of output signals produced from a comparator circuit.

FIG. 5 illustrates an example of output signals produced from the comparator circuit 12d.

In general, an amplifier mounted in a general-purpose IC may not have characteristics appropriate for the amplification of a minute signal such as a detection result obtained from the hall element 20. Specifically, noise (1/f noise, for example) may be superimposed on an amplified signal (waveform WV2 in the drawing) produced from an amplifier that does not have characteristics appropriate for the amplification of the detection result from the hall element 20, unlike an operational amplified signal (waveform WV1 in the drawing) produced from an amplifier that is appropriate for the amplification of the detection result from the hall element 20. As a result, jitters occur in a digital signal (waveform WV4 in the drawing) based on the amplified signal of the illustrated waveform WV2, unlike a digital signal (waveform WV3 in the drawing) based on the amplified signal of the illustrated waveform WV1. In this case, a digital signal output from the comparator circuit 12d may not be a signal that appropriately indicates a timing at which the polarity of magnetism detected during the rotation of the motor MT is changed. Therefore, if the microcomputer 11a controls the gate driver 12e according to this digital signal, the rotation of the motor MT may not be appropriately controlled.

The operational amplification circuit 12c in the arithmetic circuit 10 in this embodiment can adjust (compensate) the offset voltages of the first operational amplifier OP1 and second operational amplifier OP2. Therefore, the arithmetic circuit 10 in this embodiment can restrain noise from being superimposed on the amplified signal in spite of the first operational amplifier OP1 and second operational amplifier OP2 being mounted in a general-purpose IC. In particular, when the offset voltages are adjusted, 1/f noise at low frequencies can be restrained. In the arithmetic circuit 10 in this embodiment, therefore, the microcomputer 11a can control the gate driver 12e and can drive the motor MT, according to an appropriate digital signal.

In the operational amplification circuit 12c in the arithmetic circuit 10 in this embodiment, the open/closed states of the three-pole switch SW1 and three-pole switch SW2 are switched by operation clocks. Therefore, the arithmetic circuit 10 in this embodiment can switch the state of the operational amplification circuit 12c to the first state and second state with a simple structure in a general-purpose IC.

In the arithmetic circuit 10 in this embodiment, the positive-pole pattern (in this example, the line LN1) and negative-pole pattern (in this example, the line LN2) of the power supply lines of the power supply that drives a logical operation circuit (in this example, the microcomputer 11a) are formed as twisted pair patterns by using a semiconductor material in the package. If a single terminal is used as both a terminal through which the power supply of the digital circuit 11 is grounded and a terminal through which the power supply of the analog circuit 12 is grounded (that is, the common ground terminal tGND is used), the operation of the digital circuit 11 may affect the potential of the common ground terminal tGND. This may affect the operation of the analog circuit 12. In the arithmetic circuit 10 in this embodiment, since the line LN1 and line LN2 are twisted, the inductance component of the patterns can be reduced, so it is possible to make the analog circuit 12 less likely to be affected by noise.

In the arithmetic circuit 10 in this embodiment, the bypass capacitor Cbp is placed in the vicinity of the microcomputer 11a in the digital circuit 11. In the arithmetic circuit 10 in this embodiment, a loop area is reduced by placing the digital voltage terminal tVD and common ground terminal tGND close to each other to make the effect of noise less likely to be received. In the arithmetic circuit 10 in this embodiment, therefore, it is possible to restrain the operation of the digital circuit 11 from affecting the potential of the common ground terminal tGND.

In the arithmetic circuit 10 in this embodiment, the negative-pole power supply line of the logical operation circuit in the digital circuit 11 and the negative-pole power supply line of the comparator circuit 12d in the analog circuit 12 are grounded through a single terminal (in this example, the common ground terminal tGND). In the arithmetic circuit 10, therefore, the digital circuit 11 and analog circuit 12 can be grounded without having to add a new ground terminal. Thus, the size of the package of the arithmetic circuit 10 in this embodiment can be made smaller than when a new terminal is added.

The control circuit 1 in this embodiment has the arithmetic circuit 10, the hall element 20 that outputs a differential signal, and a switching circuit that outputs a three-phase alternating-current signal according to an output from the comparator circuit 12d (in this example, the switching circuit is the inverter 30). The control circuit 1 drives the motor MT by using an output from the inverter 30. Thus, the control circuit in this embodiment can control the motor MT by using the arithmetic circuit 10 in which a digital circuit and an analog circuit are formed in the same package. This enables the control circuit 1 in this embodiment to control the motor MT by using the arithmetic circuit 10 having a small mounting area.

A display orientation detecting system, which will be denoted S, in a second embodiment of the present disclosure will be described with reference to the drawings. The same elements as in the first embodiment described above will be denoted by the same reference characters and repeated descriptions will be omitted.

Figure 6:
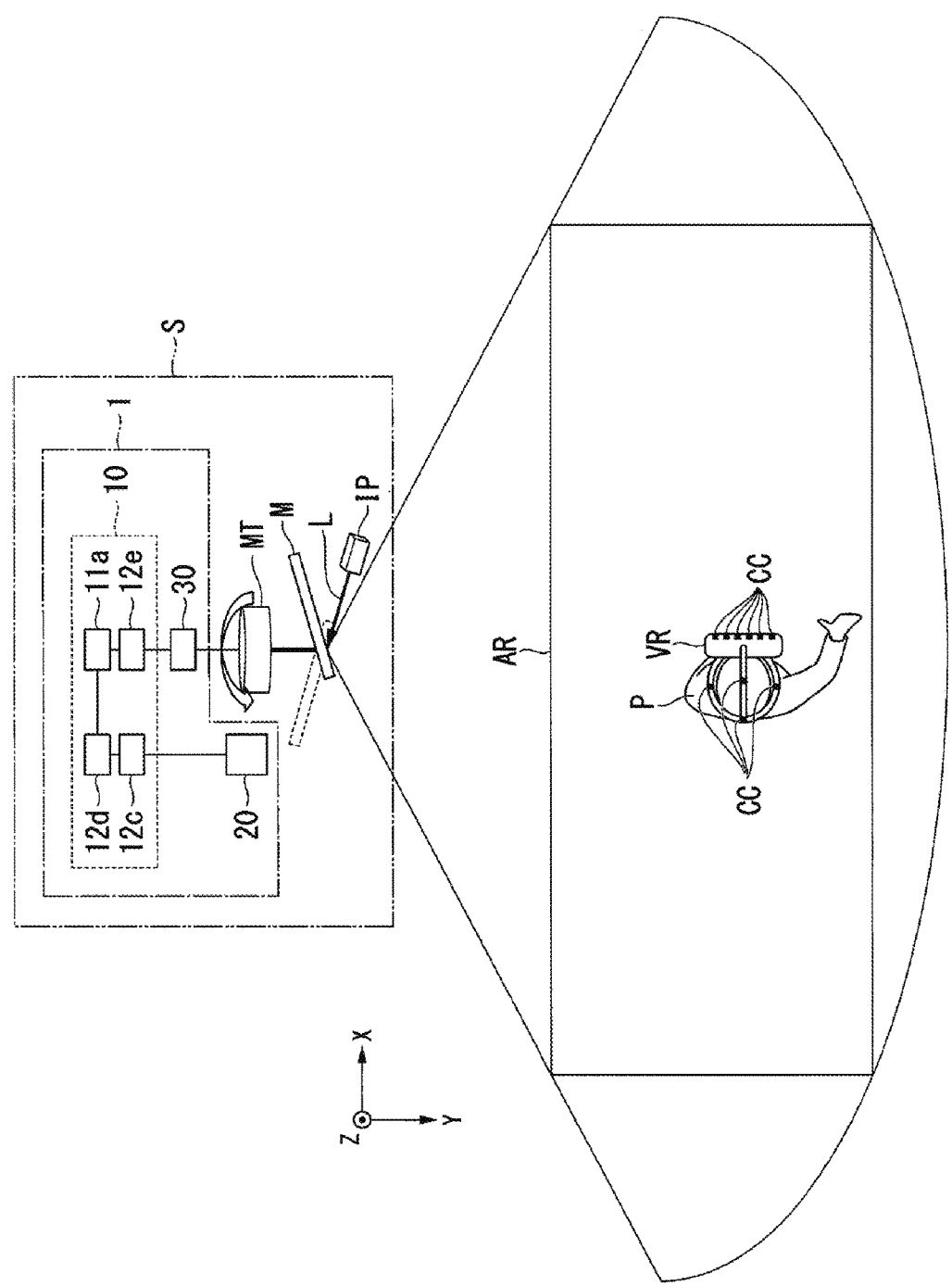
FIG. 6 illustrates a display orientation detecting system in a second exemplary embodiment of the present invention.

FIG. 6 outlines the display orientation detecting system S in the second embodiment.

Specifically, FIG. 6 illustrates a space in which the display orientation detecting system S is installed. In the description below, the space in which the display orientation detecting system S is installed will be sometimes simply referred to as the space. In the description below, an XYZ orthogonal coordinate system will be used to explain the direction of the space. In the example in FIG. 6, an XY plane is parallel to a floor plane in the space. The Z axis indicates the height direction of the space. In the description below, the positive direction of the X axis will be referred to as the right or right direction and the negative direction of the X axis will be referred to as the left or left direction.

The display orientation detecting system S has the control circuit 1, the motor MT, a mirror M, and an illuminating unit IP. The illuminating unit IP has the mirror M. The motor MT is driven under control of the control circuit 1. The illuminating unit IP emits a laser beam (indicated by L in the drawing). The laser beam L is reflected by the mirror M. The mirror M and motor MT are mutually connected. The angle of the mirror M with respect to the angle of incidence of the laser beam L is changed by driving the motor MT. Therefore, the display orientation detecting system S scans a predetermined range (indicated as a range AR in the drawing) with the laser beam L.

A subject, which will be denoted P, who wears a head-mounted display (referred to below as the display VR) is present in the range AR. The display VR is, for example, a virtual reality (VR) goggle. The display VR has a plurality of light-receiving sensors, each of which will be denoted CC. Each light-receiving sensor CC receives the laser beam L emitted from the display orientation detecting system S (specifically, from the illuminating unit IP). The display orientation detecting system S scans the range AR with the laser beam L at intervals of a predetermined length of time. The display VR detects the position and orientation of the display VR (that is, the subject P) in the range AR according to an angle at which each light-receiving sensor CC has received the laser beam L, differences in time taken from when the laser beam L has been emitted from the display orientation detecting system S until each the light-receiving sensor CC receives the laser beam L.

In the example in FIG. 6, the subject P faces in the right direction of the space. In this state, each light-receiving sensor CC receives the laser beam L with which the display orientation detecting system S scans the area AR, and the display VR detects that the subject P faces in the right direction. According to the detected direction, the display VR displays an image matching the direction. Thus, the subject P can experience VR.

The display VR may have a light-receiving sensor CC in the height direction so as to detect the orientations of the subject P in three-dimensional directions including an orientation in the Z direction besides an orientation in an XY plane and to display an image according to the detected orientations.

As described above, the display orientation detecting system S in this embodiment has the control circuit 1, the illuminating unit IP (specifically, the mirror M), and the motor MT that drives the mirror M so that a predetermined range (in this example, the range AR) in which a head-mounted display (in this example, the display VR) is present is scanned with the laser beam L. The display VR receives the laser beam L, detects its position in the range AR according to the reception result, and displays an image matching the position.

If noise (for example, 1/f noise) is superimposed on the amplified signal produced from the operational amplification circuit 12c in the arithmetic circuit 10, it may be difficult for the display orientation detecting system S to emit the laser beam L in the range AR at an appropriate timing. In this case, it may be difficult for the display VR to appropriately detect the position of the display VR (that is, the subject P). Specifically, in the display VR, a timing at which to display an image may be advanced or delayed by a time equal to a jitter, in a digital signal, corresponding to the noise in the amplified signal. If the display VR does not display an image at an appropriate time, a deviation may occur between the motion of the subject P and a timing at which an image is displayed. This may cause the subject P to feel uncomfortable (VR sick).

In the display orientation detecting system S in this embodiment, the motor MT is driven by the control circuit 1 that has the arithmetic circuit 10 in which noise is restrained from being superimposed on an amplified signal. This enables the display orientation detecting system S in this embodiment to emit the laser beam L in the range AR at an appropriate timing. Therefore, the display VR can display an image at an appropriate timing. Accordingly, the display orientation detecting system S in this embodiment can restrain the subject P from feeling uncomfortable (VR sick), which would otherwise be caused by an image on the display VR.

The structures in the above embodiments and variations may be appropriately combined within a range in which any contradiction does not occur among them.

For example, the control circuit 1 in the present disclosure may be used as a control circuit for a motor used to rotate an impeller, having vanes, for a ceiling fan or the like. Since the use of the structure in the present disclosure reduces variations in rotational speed, noise and vibration caused by the ceiling fan, which is a high-order system, can be reduced.

For example, the control circuit 1 in the present disclosure may be used as a control circuit for a motor used to feed paper in a copy machine or another office automation (OA) device. Since the use of the structure in the present disclosure reduces variations in rotational speed, printing mistakes can be more reduced.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An arithmetic circuit comprising:
an auto-zero amplification circuit that compensates an offset of an entered differential signal;
a comparator circuit that converts an output signal from the auto-zero amplification circuit to a digital signal;
a clock supply circuit that supplies an operation clock, which is a periodic pulse signal; and
a logical operation circuit that operates according to the clock supply circuit; wherein
the auto-zero amplification circuit and the comparator circuit are provided in a same package;
the auto-zero amplification circuit includes a first operational amplifier that amplifies the differential signal and produces the output signal and a second operational amplifier that adjusts an offset voltage of the first operational amplifier;
the auto-zero amplification circuit includes two states including are a first state in which an offset voltage of the second operational amplifier is adjusted and a second state in which the offset voltage of the first operational amplifier is adjusted by using an output from the second operational amplifier having the offset voltage that has been adjusted in the first state; and
the operation clock supplied by the clock supply circuit is used to select a switching timing signal for use in switching between the first state and the second state.

2. The arithmetic circuit according to claim 1, wherein a positive-pole pattern and a negative-pole pattern of power supply lines of a power supply that drives the logical operation circuit include twisted pair patterns of a semiconductor material in the package.

3. The arithmetic circuit according to claim 1, wherein a bypass capacitor is located in a vicinity of the logical operation circuit.

4. The arithmetic circuit according to claim 1, wherein a negative-pole power supply line of the logical operation circuit and a negative-pole power supply line of the comparator circuit are grounded through a single terminal.

5. A control circuit comprising:
the arithmetic circuit according to claim 1;
a hall device that outputs the differential signal; and
a switching circuit that outputs a three-phase alternating-current signal according to an output from the comparator circuit; wherein
the control circuit drives a motor by using an output from the switching circuit.

6. A display orientation detecting system comprising:
the control circuit according to claim 5;
an illuminator that emits a laser beam; and
a motor that drives a mirror so that a predetermined range in which a head-mounted display is present is scanned with the laser beam; wherein
the head-mounted display receives the laser beam, detects a position of the head-mounted display in the predetermined range according to a reception result, and displays an image matching the position.

7. An arithmetic circuit comprising:
an auto-zero amplification circuit that compensates an offset of an entered differential signal; and
a comparator circuit that converts an output signal from the auto-zero amplification circuit to a digital signal;
a clock supply circuit that supplies an operation clock, which is a periodic pulse signal; and a logical operation circuit that operates according to the clock supply circuit; wherein the auto-zero amplification circuit includes a first operational amplifier that amplifies the differential signal and produces the output signal and a second operational amplifier that adjusts an offset voltage of the first operational amplifier; and the auto-zero amplification circuit and the comparator circuit are provided in a same package.

* * * * *